(12) United States Patent
Tan

(10) Patent No.: US 6,650,177 B1
(45) Date of Patent: Nov. 18, 2003

(54) SYSTEM AND METHOD FOR TUNING AN RC CONTINUOUS-TIME FILTER

(75) Inventor: Nianxiong Tan, Laguna Niguel, CA (US)

(73) Assignee: Globespanvirata, Inc., Red Bank, NJ (US)

( * ) Notice: Subject to any disclaimer, the term of this patent is extended or adjusted under 35 U.S.C. 154(b) by 0 days.

(21) Appl. No.: 10/213,502

(22) Filed: Aug. 6, 2002

Related U.S. Application Data (60) Provisional application No. 60/310,690, filed on Aug. 7, 2001, provisional application No. 60/310,665, filed on Aug. 7, 2001, and provisional application No. 60/310,692, filed on Aug. 7, 2001.

(51) Int. Cl.[7] .............................. H03B 1/00; H03K 5/00; H04B 1/00

(52) U.S. Cl. ............... 327/553; 327/558; 327/341; 327/344; 327/345

(58) Field of Search ....................... 327/552–559, 327/336, 341, 344, 345, 512, 513

(56) References Cited

U.S. PATENT DOCUMENTS 6,501,322 B1 * 12/2002 Bidenbach et al. ......... 327/336
6,577,188 B2 * 6/2003 Ueno et al. ................. 330/85
2002/0019783 A1 * 2/2002 Duncan et al. ............. 327/554

* cited by examiner

Primary Examiner—Terry D. Cunningham
Assistant Examiner—Quan Tra
(74) Attorney, Agent, or Firm—Thomas, Kayden, Horstemeyer & Risley

(57) ABSTRACT

Methods and systems for tuning an RC continuous-time filter are disclosed. In this regard a representative system for tuning an RC continuous-time filter includes a coarse-tuned resistive element coupled to an input of the filter for varying the cut-off frequency of the filter based upon process variations. The system also includes a MOSFET transistor coupled to the resistive element. The MOSFET transistor provides a resistance dependent upon a voltage offset provided to the gate of the transistor, wherein the resistance of the transistor offsets an adjustment in the resistance of the resistive element caused by temperature variations. The system also includes a voltage offset generator configured to provide the voltage offset to the transistor.

24 Claims, 6 Drawing Sheets

SYSTEM AND METHOD FOR TUNING AN RC CONTINUOUS-TIME FILTER

CROSS-REFERENCE TO RELATED APPLICATION

This application claims priority to the following co-pending U.S. provisional patents: a) U.S. Provisional Patent Application Serial No. 60/310,690 filed on Aug. 7, 2001, and entitled "Quad AFE for DSL CO Applications," b) U.S. Provisional Patent Application Serial No. 60/310,668, filed Aug. 7, 2001, and entitled "High-pass Receive Filter for VDSL," c) U.S. Provisional Patent Application Serial No. 60/310,665, filed on Aug. 7, 2001 and entitled "ADC Buffer for High-bandwidth ADCs," and d) U.S. Provisional Patent Application Serial No. 60/310,692, filed Aug. 7, 2001 and entitled "Automatic Tuning Technique for Analog Filters," which are all hereby incorporated by reference in their entirety.

This application is also related to the following co-pending U.S. utility patent applications: a) "Wide-Band Analog Front-End for DSL Applications," having Ser. No. (unknown), filed Aug. 6, 2002, with U.S. Express Mail Package No. EL924321582US; b) "Improved Active Filter and Method," having Ser. No. (unknown), filed Aug. 6, 2002, with U.S. Express Mail Package No. EL924321619US; and c) "A Buffer Circuit for a High-Bandwidth Analog to Digital Converter," having Ser. No. (unknown), filed Aug. 6, 2002, with U.S. Express Mail Package No. EL924321605US; which are all incorporated by reference herein in their entirety.

FIELD OF THE INVENTION

The present invention generally relates to communications systems wherein signal information is processed in analog forms. More specifically, the invention relates to systems and methods for tuning resistance-capacitance ("RC") continuous-time filters.

BACKGROUND OF THE INVENTION

RC continuous-time filters are utilized in many applications, including communications systems. As with other types of filters, RC continuous-time filters may be designed to selectively filter out parts of a signal that have frequencies above or below a desired cut-off frequency. Typically, RC continuous-time filters are utilized in applications where the signals are expected to remain continuous in time and have continuous or analog levels. Since continuous-time filters can typically be utilized without the need for signal sampling, continuous-time filters provide a significant operating-speed advantage over the switched-capacitor filter counterparts.

One example of a popular application in which RC continuous-time filters are utilized is digital subscriber line ("DSL") communications systems. DSL communications systems have been introduced and implemented by communications systems providers in recent years to provide customers with a wide variety of interactive multi-media communications signals over existing plain old telephone system ("POTS") communications lines. As is known in the art, a typical DSL communications system may include, among other components, an analog front end ("AFE").

In practice, generally, a digital transmit signal may be provided to an AFE, where the AFE converts the digital signal to analog for transmission along the POTS system. The AFE may also contain a plurality of filters used to eliminate any out of band noise that may have been generated by preceding stages in the system or during the digital to analog conversion. The. analog transmit signal is then sent to a line driver to amplify the signal for transmission. In the receive path, the AFE may convert an analog receive signal into digital and, likewise, properly filter out any out-of-band noise. In some instances, the filters may be analog filters, and in others digital filters.

Within the AFE of a DSL communications system, one or more RC continuous-time filters may be utilized to perform the filtering mentioned above, as well as possibly for other purposes. Typically, the components of a DSL system are contained in a common location. As a result of this practice, DSL system components, including RC continuous-time filters integrated within the AFE, may be subject to temperature variations affected by ambient temperature variations. For example, in typical applications of DSL communications systems, operating temperatures of system components may vary from −40° C. to 125° C. due to ambient temperature and/or operating condition variations.

It is noted that the preceding discussion, with respect to DSL communications systems, merely presents one example of the utilization of RC continuous-time filters, and there are many other applications in which RC continuous-time filters are or may be utilized and in which temperature variation may be a concern.

Although RC continuous-time filters offer an operating-speed advantage, as discussed above, these filters typically require some means of tuning in order to set and maintain a desired cut-off frequency. One reason that tuning of RC continuous-time filters is desired is because the cut-off frequency of the filter is dependent on the values of the resistance and capacitance elements of the filter, and these values will typically vary due to temperature variations. For example, in a filter built with "High-resitivity Poly0" resistors and "Interpoly" capacitors (note, these component types are known in the art and have certain temperature variation characteristics), the variation in cut-off frequency may vary by as much as 0.15%/° C. In contrast, an acceptable range of cut-off frequency variation, depending on the application, is typically less than 0.04%/° C. It is noted that in an RC continuous-time filter that is built with High-resitivity Poly0 resistors and Interpoly capacitors, the temperature variation of the RC component of the filter, and thus the cut-off frequency of the filter, is typically dominated by the temperature variation of the resistors which can be as large as 0.15% per ° C.

Therefore, there is a need for improved methods, systems and devices for tuning RC continuous-time filters in order to set and maintain cut-off frequencies within acceptable tolerances with regard to temperature variations.

SUMMARY OF THE INVENTION

The present invention relates to improved methods, systems, and devices for tuning RC continuous-time filters in order to set and maintain cut-off frequencies with regard to temperature variations. A representative method for tuning an RC continuous-time filter includes: varying the resistance of a coarse-tuned resistive element coupled to an input of the filter for varying the cut-off frequency of the filter based upon process variations; and continuously adjusting the resistance of a MOSFET transistor in series with the resistive element, such that the adjustment in the resistance of the transistor offsets the adjustment in the resistance of the resistive element, due to temperature variations.

In another embodiment, a system for tuning an RC continuous-time filter includes a coarse-tuned resistive element coupled to an input of the filter for varying the cut-off frequency of the filter based upon process variations. The system also includes a MOSFET transistor coupled to the coarse-tuned resistive element, wherein the MOSFET transistor provides a resistance dependent upon a voltage offset provided to the gate of the transistor. The resistance of the MOSFET transistor offsets an adjustment in the resistance of the coarse-tuned resistive element, due to temperature variations. Also included in the system is a voltage offset generator configured to provide the voltage offset to the MOSFET transistor.

Another embodiment of the invention may be construed as an automatically-tunable RC integrator. The integrator includes a coarse-tuned resistive element coupled to an input of the integrator for varying the cut-off frequency of the integrator based upon process variations. The integrator also includes a MOSFET transistor coupled to the coarse-tuned resistive element. The MOSFET transistor provides a resistance dependent upon a voltage offset provided to the gate of the MOSFET transistor, wherein the resistance of the MOSFET transistor offsets an adjustment in the resistance of the coarse-tuned resistive element due to temperature variations.

In yet another embodiment, a system for tuning an RC integrator includes means for varying the resistance of a coarse-tuned resistive element coupled to an input of the integrator for varying the cut-off frequency of the integrator based upon process variations. The system also includes means for continuously adjusting the resistance of a MOSFET transistor in series with the coarse-tuned resistive element, such that the adjustment in the resistance of the MOSFET transistor offsets the adjustment in the resistance of the coarse-tuned resistive element, due to temperature variations.

Other systems, methods, features, and advantages of the present invention will become more apparent to one with skill in the art upon examination of the following drawings and detailed description. It is intended that all such additional systems, methods, features, and advantages be included within this description, be within the scope of the present invention, and be protected by the accompanying claims.

BRIEF DESCRIPTION OF THE DRAWINGS

The present invention will be more fully understood from the detailed description given below and from the accompanying drawings of the preferred embodiment of the invention, which however, should not be taken to limit the invention to the specific embodiments enumerated, but are for explanation and for better understanding only. Furthermore, the drawings are not necessarily to scale, emphasis instead being placed upon clearly illustrating the principles of the invention. Finally, like reference numerals in the figures designate corresponding parts throughout the several drawings.

DETAILED DESCRIPTION

As mentioned, the invention should not be limited to the specific embodiments illustrated herein. In particular, FIGS. 1–3 aim to illustrate one exemplary environment in which embodiments of an RC continuous-time filter may be found. The invention should not be limited to xDSL communication systems, nor any telecommunication system for that matter.

Figure 1:
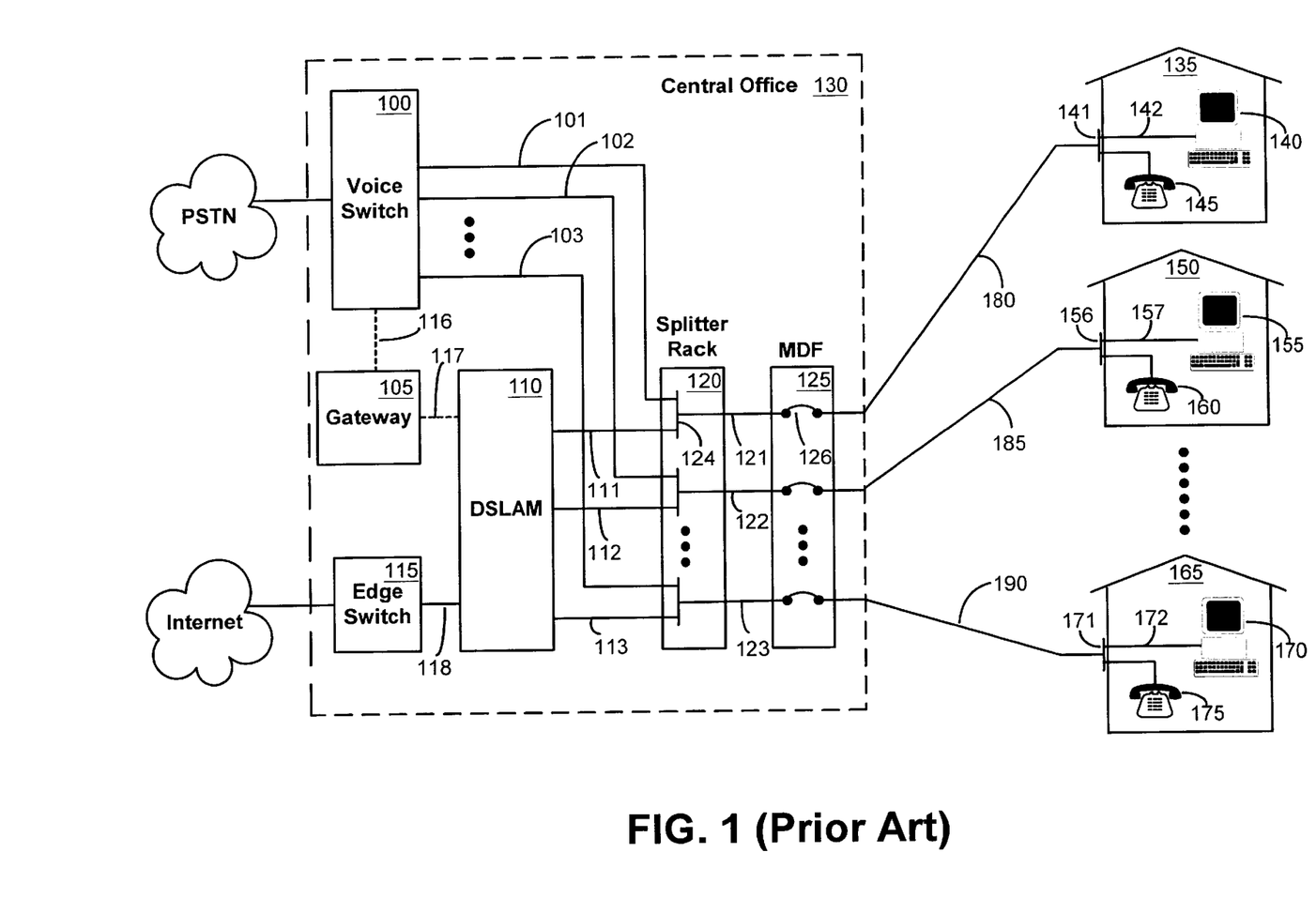
FIG. 1 is an illustration of a typical central office providing full-rate xDSL service to multiple residential customers.

Turning now to the drawings illustrating the present invention, wherein like reference numerals designate corresponding parts throughout the drawings, FIG. 1 is an illustration of a typical central office 130 providing full-rate xDSL service to multiple residential customers.

To define some commonly used terms in telecommunication applications, data flowing in the general direction from residences 135, 150, 165 towards the central office (CO) 130 is typically referred to as "upstream" data, while data flowing in the opposite direction, from CO 130 towards residences 135, 150, 165, is termed "downstream" data. Also, the communication links that exist between one CO 130 and another in the public switched telephone network (PSTN), are generally referred to as "trunks," while the communication links between the CO 130 and residences 135, 150, 165 are referred to as "lines" 180, 185, and 190.

While the explanation in this disclosure may often refer to only one direction of data flow for ease of explanation, it will be understood that the data flow within the various elements shown in FIG. 1, is generally bi-directional in nature, and the circuits and methods explained in this disclosure may be implemented in either direction.

The DSL access multiplexer (DSLAM) 110, shown located inside the CO 130, is a major component of any system that is designed to provide DSL service, such as Asymmetric DSL (ADSL) to multiple customers from a centralized location. On the trunk side of the DSLAM, a high speed data link 118 is shown connecting it to an edge switch 115. Data link 118 may, for example, carry data packets contained inside an asynchronous transfer mode (ATM) transport mechanism. These data packets are suitably routed by the edge switch 115, and are transported from and into the Internet, as shown in FIG. 1.

An alternative trunk side high-speed data link 117, shown as a dotted connection in FIG. 1, may be provided in certain applications, wherein the DSLAM 110 transmits data packets contained within a suitable transport mechanism, such as an OC-3 link, into the gateway 105. The gateway translates the packet format into a time division multiplex (TDM) format which can be processed by the voice switch 100 before transmission into the PSTN.

On the line side of DSLAM 110, communication links 111, 112 and 113 are three of "n" communication links that connect the DSLAM 110 into the splitter rack 120. While FIG. 1 depicts the splitter rack 120 as existing external to DSLAM 110, several system configurations physically incorporate the splitter functionality within the DSLAM 110. The links 111, 112 and 113 carry the downstream and upstream DSL data.

Communication links 101, 102 and 103 are three of "n" communication links that connect the voice switch 100 to the splitter rack 120. Links 101, 102 and 103 carry analog voice frequency signals bi-directionally. Splitter 124 is one of several splitters contained in the splitter rack 120.

Splitter 124, used here for explanation purposes in a full-rate ADSL application, combines the downstream ADSL signal that is transmitted by the DSLAM 110 via link 111, with the analog voice frequency (VF) signal carried from voice switch 100 over link 101, before transmitting it to the main distribution frame (MDF) 125, via link 121. Splitter 124 is so named, because it "splits" the DSL signal from the analog VF signal, in the opposite (upstream) direction.

The MDF 125, is a centralized CO wiring interface, where the wires entering and exiting a CO are interconnected. For example, link 121, which may consist of an unshielded twisted pair (UTP) of wires used inside the CO building, is interconnected by jumper 126, to the external twisted wire pair 180 which is generally designed to be enclosed inside a shielded cable assembly.

The downstream ADSL signal together with the downstream analog VF signal that is present at jumper 126 is connected by data link 180, which is generally a residential POTS line, to the residence 135. Splitter 141 is located on the outside wall of residence 135, and splits the signal transmitted from the interconnection 126, into an analog VF signal and a downstream ADSL signal.

The analog VF signal may be routed to a telephone 145, as shown in FIG. 1, while the downstream ADSL signal is connected to a PC 140, via communication link 142. The ADSL signal entering PC 140 is generally routed to an ADSL modem that may be installed inside the PC 140 or may be installed as an external modem that is cabled into the PC 140.

While FIG. 1 depicts a full-rate ADSL system, another ADSL system, termed ADSL G.Lite, has proved popular for residential applications. ADSL G.Lite is a band-limited version of full-rate ADSL, and is advantageous because it eliminates the need for splitters. Splitters are used in full-rate applications to block interference from the high frequency components of the downstream ADSL signal, that may cause a disturbance in the telephones at the receiving end. ADSL G.Lite applications employ customer-installable signal filters that are placed in-line with each telephone that is connected to the ADSL line. The ADSL G.Lite process eliminates the cost of a "truck-roll" that is generally required for installing splitters at a customer's residence in the case of a full-rate ADSL application.

Figure 2:
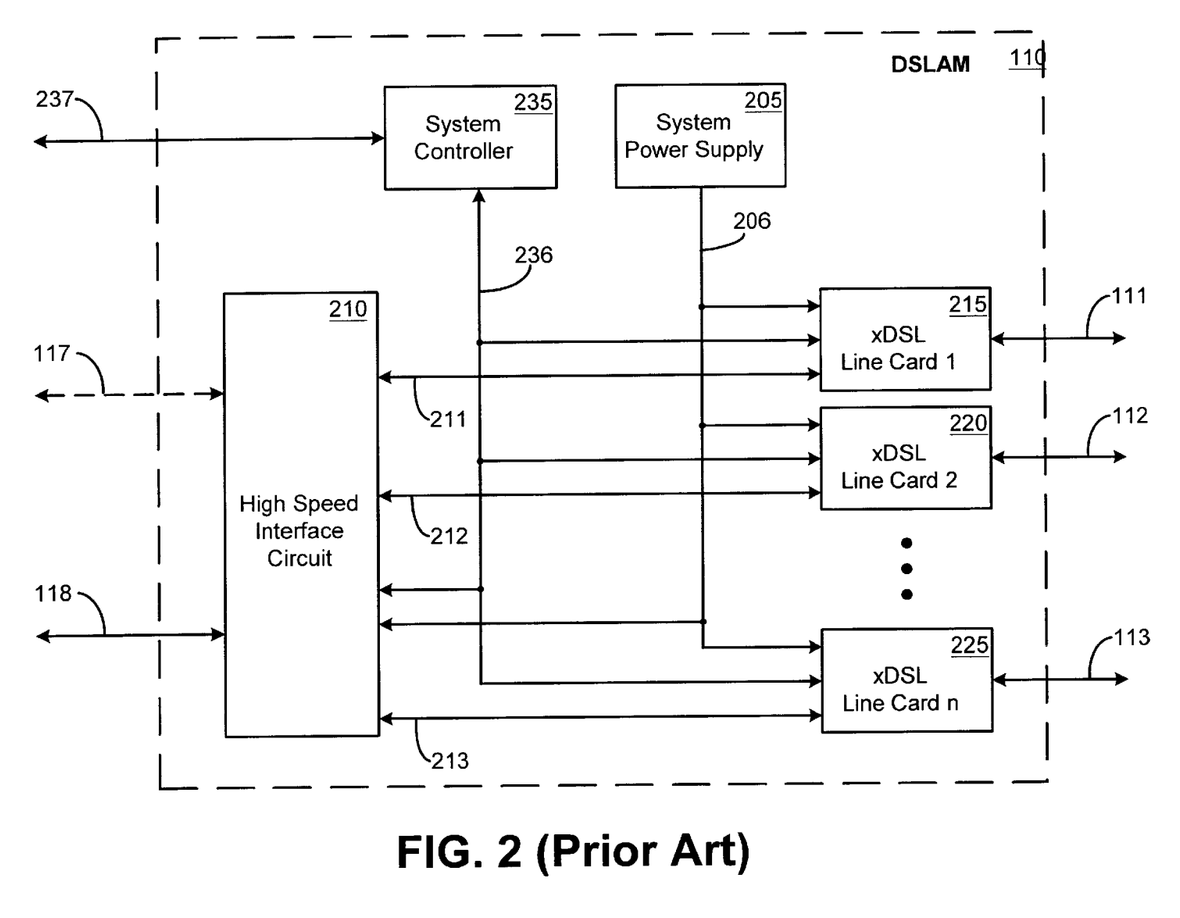
FIG. 2 is a block diagram representation of the main functional blocks inside a typical DSLAM.

FIG. 2 is a block diagram representation of the main functional blocks inside a typical DSLAM 110. The various blocks shown in FIG. 2, generally represent circuit packs that are plugged into a DSLAM chassis. The circuit pack architecture permits easy insertion and/or removal, thereby permitting a certain degree of flexibility in configuring the DSLAM 110 to provide various types of DSL service. It also allows relatively easy replacement of defective circuit packs, a replacement that may be carried out while the DSLAM 110 is in operation without generally affecting the multiple customers that are being provided DSL service.

The high-speed data link 118, as well as the optional high speed data link 117, which were referred to earlier in FIG. 1, are the trunk-side connections of the high-speed interface circuit 210. Data link 118, may carry data packets over various transport protocols, such as ATM and TCP/IP. On the line side of the interface circuit 210, low-speed data links such as links 211, 212 and 213 connect the high speed interface circuit 210 to multiple line cards. The line cards shown in FIG. 2 may be composed of several different types of cards to cater to a mix of xDSL services, such as the previously discussed ADSL, as well as Synchronous DSL (SDSL), High bit-rate DSL (HDSL), Very High bit-rate DSL (VDSL), etc..

ADSL is a popular service provided for residential customers, due to the asymmetrical nature of data usage, wherein more data flows towards the customer in the downstream direction, in comparison to the upstream data flow. The larger downstream data flow is generally attributed to accessing Internet Web sites. When a Web site is accessed, a relatively large amount of data related to the Web page is transmitted downstream to a browser located in a customer's PC. The bulk of the upstream data is generally attributable to traffic (e-mail, web page, attachments, etc.) directed towards other Internet users, and this constitutes a smaller data volume than the one traveling downstream.

Business users may prefer a more symmetric data flow, and SDSL may be more suitable for such purposes. Correspondingly, a typical DSLAM may include a number of ADSL line cards together with SDSL, HDSL, and/or VDSL line cards.

HDSL, one of the earliest forms of DSL, may be used for wide-band digital transmission within a corporate site and between the CO 130 and a customer premise. The main characteristic of HDSL is that it is symmetrical: an equal amount of bandwidth is available in both directions. HDSL can carry as much on a single wire of twisted-pair cable as can be carried on a T1 line (up to 1.544 Mbps) in North America or an E1 line (up to 2.048 Mbps) in Europe over a somewhat longer range and is considered an alternative to a T1 or E1 connection.

VDSL provides large amounts of bandwidth with speeds up to about 52 Mbps. In order to provide such high speeds, a large bandwidth, as mentioned, is required. Typically, the VDSL frequency band ranges from 25 kHz to up to about 12 MHz. Unfortunately, the trade-off with high frequencies is the distance the signals can travel along a copper line. The development of Fiber to the Curb (FTTC) and/or Fiber to the Neighborhood (FTTN) provides for the use of VDSL by, essentially, reducing the length of the copper loop. Fiber cables, which can support high bandwidths over long distances, are provided from the CO to Optical Network Units (ONUs) located either at the curb of residences or the gateway to a neighborhood. The ONUs can convert the optical signals into electrical signals downstream and vice-versa upstream. With the use of FTTN and or FTTC, the effective copper loop is reduce to below 4000 ft, which is the upper limit of VDSL. VDSL, for example, provides for the transmission of video signals over copper lines, which leads to applications such as digital television, Video-on-Demand, etc..

FIG. 2 depicts "n" number of xDSL line cards serving a number of residential customers. xDSL line card 1 215 provides xDSL service to residential customer 135, while xDSL line card 2 220 provides xDSL service to residential customer 150, and xDSL line card n 225 provides xDSL service to residential customer 165.

System controller 235 is used for operations, administration, maintenance and provisioning (OAM&P) purposes. Provisioning the DSLAM 110 may include such procedures as would be necessary to provide various different types of DSL service via different types of line cards. Maintenance may include inventory procedures as well as defect reporting. System controller 235 generally communicates to elements that are external to DSLAM 110, via a communication interface that is not shown in FIG. 2.

System power supply 205 provides power, typically in the form of several DC voltages that may be required to operate the circuit packs in the DSLAM 110. These voltages may include for example, +5 volts to operate the various digital ICs, and +/−15 volts to operate the line interfaces. System power supply 205 is typically powered by an external power source, such as a 48 volt battery bank, via a power-line connection that is not illustrated in FIG. 2.

Figure 3:
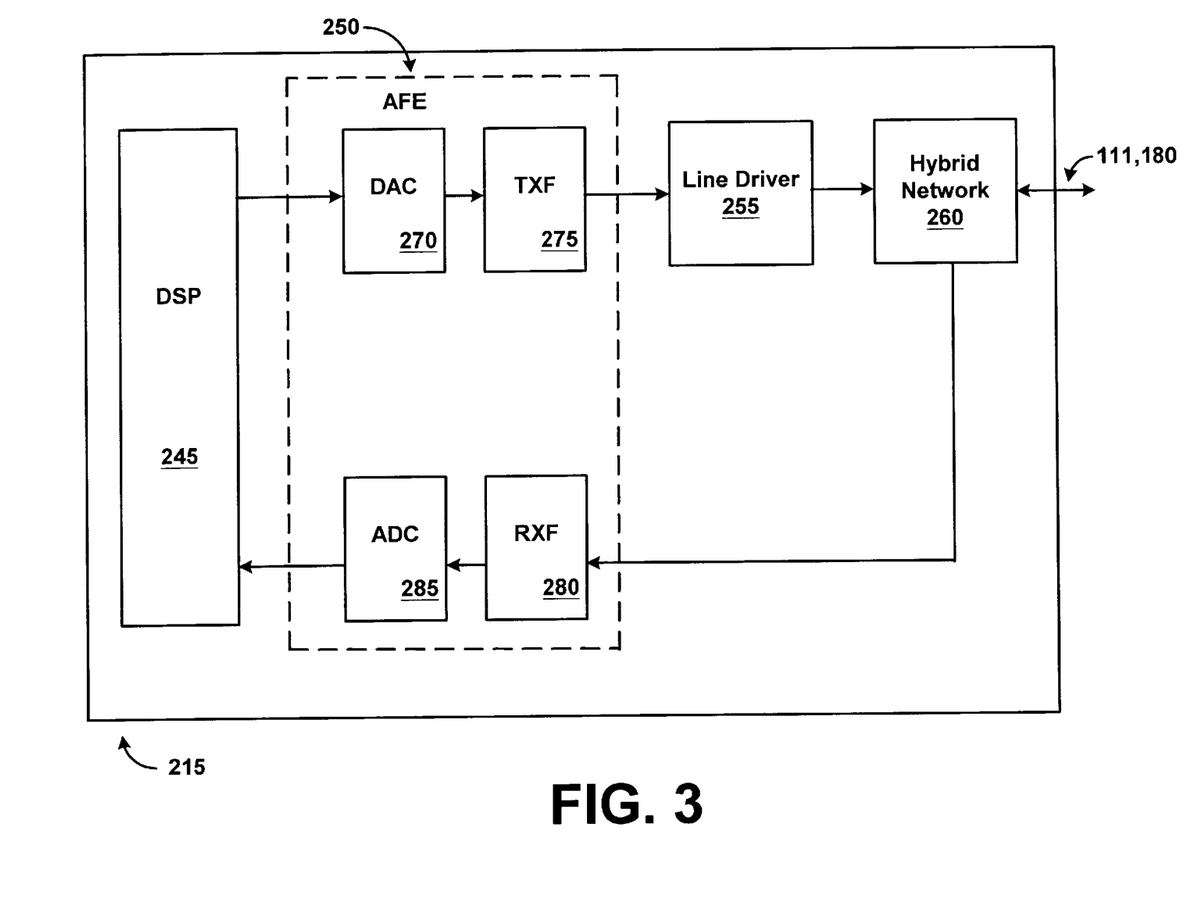
FIG. 3 is a block diagram further illustrating the xDSL central office interface card of FIG. 2.

FIG. 3 is a block diagram further illustrating the central office xDSL interface card 215 of FIG. 2. As shown by FIG. 3, with regard to the present illustration, transmission of data may be directed from the CP 135 to the CO 130, from the CO 130 to the CP 135, or in both directions at the same time via line 180. The xDSL interface card 215 located at the CO 130 may comprise a CO digital signal processor (DSP) 245, which receives information from a data source (not shown) and sends information to a CO analog front end (AFE) 250. The CO AFE 250 may interface between the local loop 180, via link 111, and the CO DSP 245 and functions to convert digital data, from the CO DSP 245, into a continuous time analog signal.

The analog signal is delivered, via a CO line driver 255, in accordance with the amount of power required to drive the amplified analog signal through a hybrid network 260, the local loop 180, and then on to the CP 135. An xDSL interface card similar to interface card 215 may be found at the CP 135 and perform the reciprocal operations as the xDSL interface card 215.

In the receive path, an upstream analog signal may be received by hybrid network 260. The hybrid network 260 may then de-couple the received signal from the transmitted signal, by subtracting the transmitted signal from the sum of the transmitted and received signals. The AFE 250 may then convert the received analog signal into a digital signal, which may then be transmitted to the DSP 245 for further digital processing.

The AFE 250 generally serves to convert a digital signal to analog in the transmit path and convert an analog signal to digital in the receive path. A digital signal from the DSP 245 may be received by a digital-to-analog converter (DAC) 270, which performs the conversion. Several filter stages and/or gain stages may be included within the AFE 250 to attenuate out-of-band noise and/or amplify the in-band signal. Typically, noise may be produced in the transmit signal from processing by the DSP 245 as well as the DAC 270. In some AFEs, digital filters may be included with the AFE 250 to filter the digital transmit signal prior to conversion. In this embodiment, an analog transmit filter block (TXF) 275 is included which will filter the analog signal. The TXF 275 may include several stages and/or several different implementations depending upon the attenuation requirements, power requirements, etc. Likewise, the TXF 275 may be configured in such a way for a specific DSL application. For example, for ADSL applications, the transmit (downstream) frequency band is typically between 138 kHz to 1.1 MHz, which may call for a high-pass filter with a cut-off frequency around 138 kHz. Other applications, such as VDSL may utilize different types of analog filters or may configure similar filters differently for different applications. Once the transmit signal is filtered, it may be provided to the line driver 255 for further processing towards transmission.

In the receive path, the AFE 250 may perform similar functions. The received analog signal may be processed by several analog filters and/or gain stages. The analog receive filters (RXF) 280 may be configured to attenuate out-of-band noise, whereas several gain stages may be configured to amplify the in-band signal. Once filtered, the analog signal may be provided to an analog-to-digital converter (ADC) 285 for conversion to digital. The digital receive signal may be further processed by digital filters (not shown) if applicable. The digital signal may be passed along to the DSP 245 for further processing.

Similar to the TXF 275, the RXF 280 may be configured for a specific application. For example, for ADSL applications, the receive (upstream) frequency band is typically between 25 kHz to 138 kHz, which may call for a low-pass filter with a cut-off frequency around 138 kHz. Other applications, such as VDSL may utilize different types of analog filters or may configure similar filters differently for different applications.

It should be noted that the description of the AFE 250 is quite general and is not expected to be interpreted as an exhaustive description as to its form and/or function. Analog front ends typically may include many more components such as buffers and programmable gain amplifiers (PGAs). These elements have been excluded from the description of the AFE 250 because they are believed to be understood by persons skilled in the art.

Figure 4:
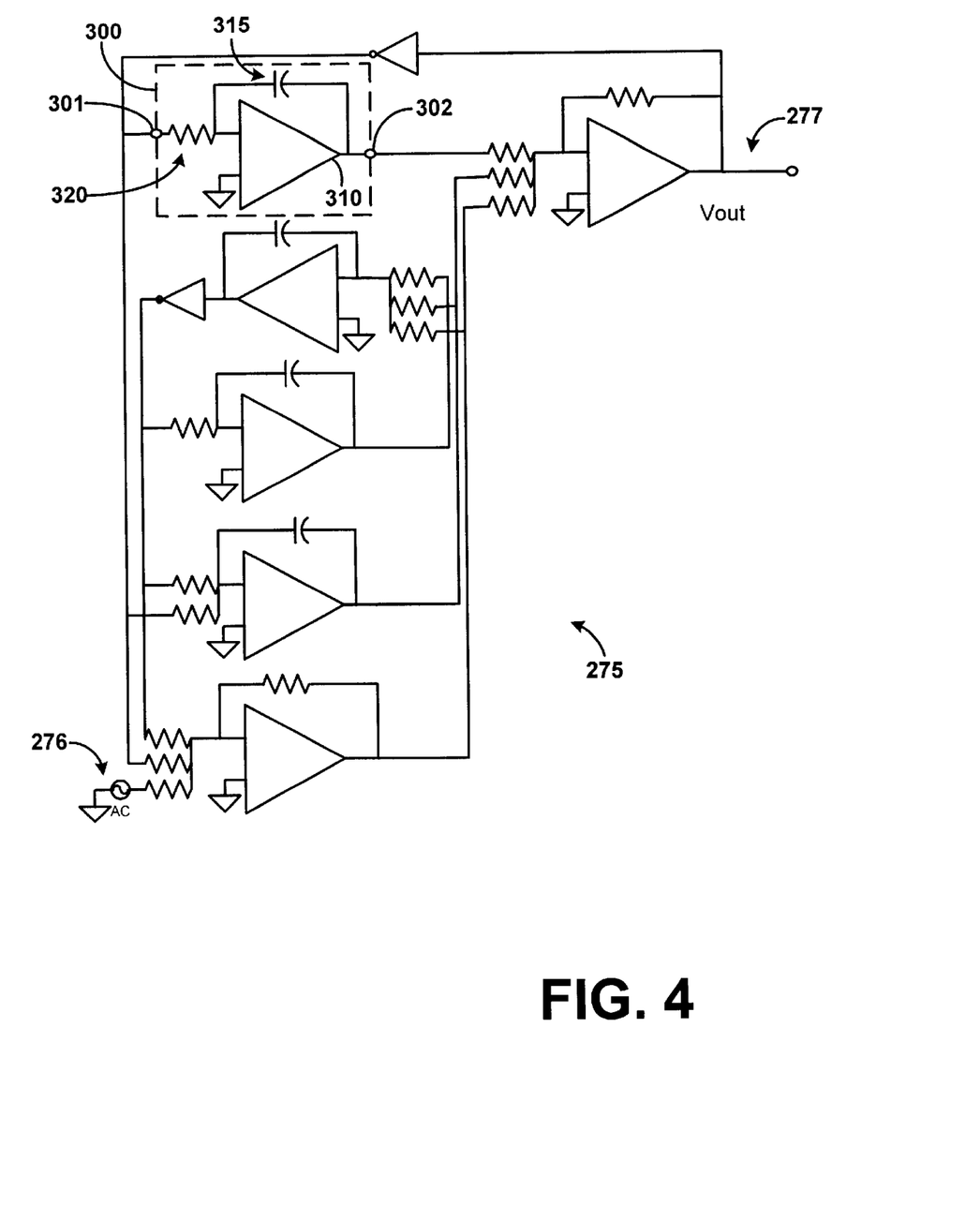
FIG. 4 is a circuit schematic further illustrating an analog transmit filter (TXF) of the analog front end (AFE) illustrated in FIG. 3.

FIG. 4 is a circuit schematic further illustrating the analog transmit filter (TXF) 275 of the AFE 250 illustrated in FIG. 3. The TXF 275 is one particular example of a transmit filter, and more, an example of an analog filter. Receive analog filters such as the RXF 280 of FIG. 3 may be similar in structure but tuned with different cut-off frequencies and passbands. This may be accomplished by varying the structure of the filter and/or by varying the component values in the circuit.

For DSL applications, the TXF 275 is typically an elliptic type filter, and more particularly, an elliptic high-pass filter for ADSL CO applications. This particular embodiment is a $3^{rd}$ order elliptic LC high-pass filter. The general practice of designing an integrated elliptic filter is to use the signal flow methodology to emulate a passive LC prototype. As can be seen, the main building block in the TXF 275 is an RC integrator 300. The RC integrator 300 is an active device, therefore requiring external power to drive an op-amp 310 in the integrator 300. Each integrator 300 may be considered an no active representation of the signal flow of a passive element (capacitor, inductor, etc.) in a passive LC prototype of the filter 275. The main advantage in utilizing the signal flow methodology, and thus active components to emulate the passive components is the low-sensitivity in the passband. Also, active components may be utilized to emulate a passive inductance on a chip, as this is not possible with a standard passive inductor. Utilizing the signal flow methodology is a well known practice in the art.

The filter 275, in the simplest form, may be made up of an analog input 276 and an analog output 277. The analog input 276 may receive the analog transmit signal from the DAC 270 (See FIG. 3) which may include harmonic generated noise in the upstream band. This noise may be generated by the DSP 245 as well as the DAC 270 and shall be attenuated by the filter 275. As mentioned, the filter includes several RC integrators 300 as building blocks, that when configured in such a way, produces a distinct frequency response for the filter 275.

The RC integrator 300 is an inverting integrator that is, generally, well known in the art. Typically, the integrator 300, includes an input 301 and an output 302. An input resistance (in this example, a single resistor (R) 320) is in series with the negative terminal of an operational amplifier (op-amp) 310. A capacitor (C) 315 provides feedback to the negative terminal of the op-amp 310. The positive terminal of the op-amp 310 is AC grounded. The response of the integrator 300 takes on the following function, $$v_o = \frac{-v_1}{j\omega\tau}$$

where τ is the time constant and is R×C. The time constant determines the pole or zero frequency. Unlike the off-chip passive realization, where the absolute value of every component can be controlled to a satisfying degree, the on-chip resistance and capacitance vary significantly from chip to chip and wafer to wafer. For example, the resistance and capacitance may from +/−10 to 25% from chip to chip. On top of that, the resistance value is typically a strong function of operating temperature. As temperature varies on the chip, the performance of the filter may be compromised because of the variations induced on the cut-off frequencies by variations in the resistance.

Figure 5:
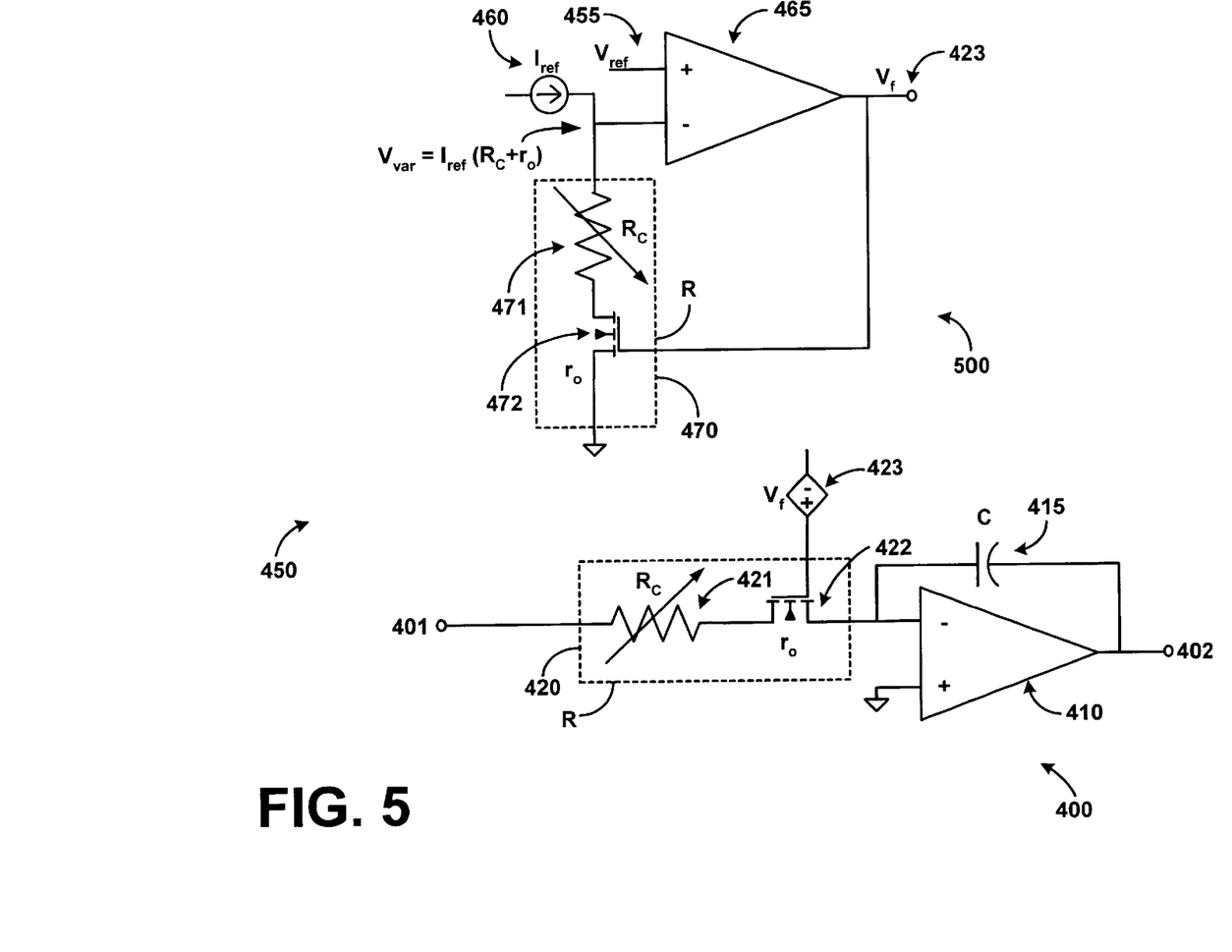
FIG. 5 is a circuit schematic illustrating a system for tuning an RC integrator in accordance with embodiments of the present invention.

FIG. 5 is a circuit schematic illustrating a system 450 for tuning an RC integrator 400 in accordance with embodiments of the present invention. The RC integrator 400 is similar to the integrator 300 of the TXF 275 of FIG. 4. Essentially, the system 400 can be incorporated into each integrator of the TXF 275 and so can be configured to tune the entire filter 275.

The resistance (R) 420 of the integrator 400 may be divided into two resistive elements: a coarse-tuned resistive element ($R_c$) 421 and a MOSFET transistor 422. The resistive element 421 may be coupled to the input 401 of the integrator 400 and the source of the transistor 422. The drain of the transistor 422 may be coupled to the negative terminal of the op-amp 410. A capacitor (C) 415 may be coupled to the output 402 of the op-amp 410 and the negative terminal of the op-amp 410 to provide for negative feedback. The positive terminal of the op-amp 410 may be AC grounded.

Due to variations in the processing and fabrication of the devices, the actual resistance value and capacitance value may differ from their respective nominal values. Different chips therefore have different filter cut-off frequencies. The coarse-tuned resistive element 421 may be tuned so that the resistance it produces may change accordingly. This resistance may be adjusted for process variations of the filter in which the integrator 400 is contained. All of the integrators of the filter are usually changed simultaneously in such a way so as to change the frequency response of the filter. The coarse tuning can be done at the training phase for DSL applications. The DSP in the DSL system can measure the filter response and adjust the coarse-tuning bits accordingly until the desired frequency response is obtained. Since the resistance and capacitance variations on the same die are correlated, we can usually coarse-tune one filter and use the same information to adjust other filters.

The coarse-tuned resistive element 421 may be a physical resistance in which resistance may be switched in or out in a digital or analog fashion. This is done during a training phase by measuring the filter response and adjusting coarse control bits (not shown) to vary the coarse-tuned resistive element 421 in discrete steps. The DSP 245 (see FIG. 3) may send a test tone(s). The AFE 250 may loop back the Tx signal as it passes through the filters. The DSP 245 may capture the data and measure the frequency response. If the frequency response is not correct, the DSP 245 may program the coarse-tune control bits until the response is correct. Unfortunately, the resistance of the resistive element 421 may drift from its nominal setting because of temperature affects.

The MOSFET transistor 422 provides for a compensation to the change in the resistance of the resistive element 421. Typically, the internal resistance, $r_o$, provides for another variable. However, $r_o$ is inversely proportional to the gate voltage, $V_f$, of the MOSFET transistor 422 and takes on the following function:

$$r_o = \frac{1}{\mu(C_{ox})(W/L)(V_f - V_T)}$$

where $\mu$ is the effective mobility and $C_{O_x}$ is the gate capacitance per unit area. W and L are the channel width and length, respectively, and $V_T$ is the threshold voltage of the transistor 422. The threshold voltage, $V_T$ is a direct function of temperature and so the rise in temperature increases $V_T$ which in turn will increase $r_o$. These and other general parameters of the MOSFET transistor 422 are generally well known in the art.

The gate voltage, $V_f$, acts as a fine-tuning voltage that can vary the internal resistance of the MOSFET transistor 422 to compensate for the change in resistance of the resistive element 421.

The system 450 also may include a gate voltage generator 500. The gate voltage generator 500 may include a non-inverting comparator made up of an op-amp 465 that provides a voltage at its output 423. A reference voltage ($V_{ref}$) 455 may be provided to the positive terminal of the comparator (op-amp 465). A coarse-tuned resistive element 471 may be coupled in series with a MOSFET transistor 472 and the resistive element 471 may be also coupled to the negative terminal of the op-amp 465. The drain of the transistor 472 is grounded. The gate voltage may be provided to the gate of the transistor 472 and acts as the feedback loop.

The coarse-tuned resistive element 471 may be of the same die as the resistive element 421 of the integrator 400 and so behaves in the same manner with regard to changes in temperature. Likewise, so is the MOSFET transistor 472. Since the resistive element 471 and the transistor 472 are in the feedback loop, the negative feedback forces the combined resistive value of the two elements 471 and 472 to be constant independent of temperature variation. Therefore, due to the matching of resistive element 471 and the transistor 472 verses the resistive element 421 and the transistor 422 of the integrator 400 (they are of the same die), the combined resistive value of the elements 421 and 422 is constant, even though $V_T$ and $r_o$ of the transistor 422 may change.

In practice, a reference current ($I_{ref}$) 460 may be provided across the resistive element 471 and the transistor 472. $I_{ref}$ 460 causes a voltage drop, $V_{var}$, across the two which is provided to the negative terminal of the op-amp 465. $V_{var}$ is then compared with $V_{ref}$ 455 and the op-amp 465 produces the gate voltage accordingly. $V_{var}$ is determined by $I_{ref}$ 460 and the resistance of the resistive element 471 and the transistor 472. The resistance of the resistive element 471 is affected by temperature in the same manner as the resistive element 421 of the integrator 400. Both the reference current 460 and the reference voltage 455 can typically be accurately generated inside the AFE 250 (See FIG. 3). The gate voltage, $V_f$, produced, is essentially the gate voltage provided to the transistor 422 of the integrator 400.

The gate voltage, $V_f$, produced by the gate voltage generator 500 may be provided to each transistor 422 of each integrator 400 of the filter 275. The system 450 may be configured to vary the reference voltage 455 and/or the reference current 460 as the coarse-tuned resistive element 471 is changed for process variations. In simplest terms, this may be accomplished by making the reference voltage 455 and/or the reference current 460 programmable according to the programming of the coarse-tuned control bits (again, not shown).

It should be noted that the gate voltage generator 500 provides for one possible means for generating the gate voltage; which acts as the fine-tuning voltage 423. Other possibilities include an automated external control system and/or another type of on-chip means. Certainly, some type of manual control could likewise be utilized.

The system 450 can therefore tune the resistances, and subsequently the cut-off frequency, of the filter in continuous time. The need for a discrete tuning system, such as a digital tuning system for fine tuning is eliminated and so problems caused by these systems, such as switching glitch, may be alleviated.

Figure 6:
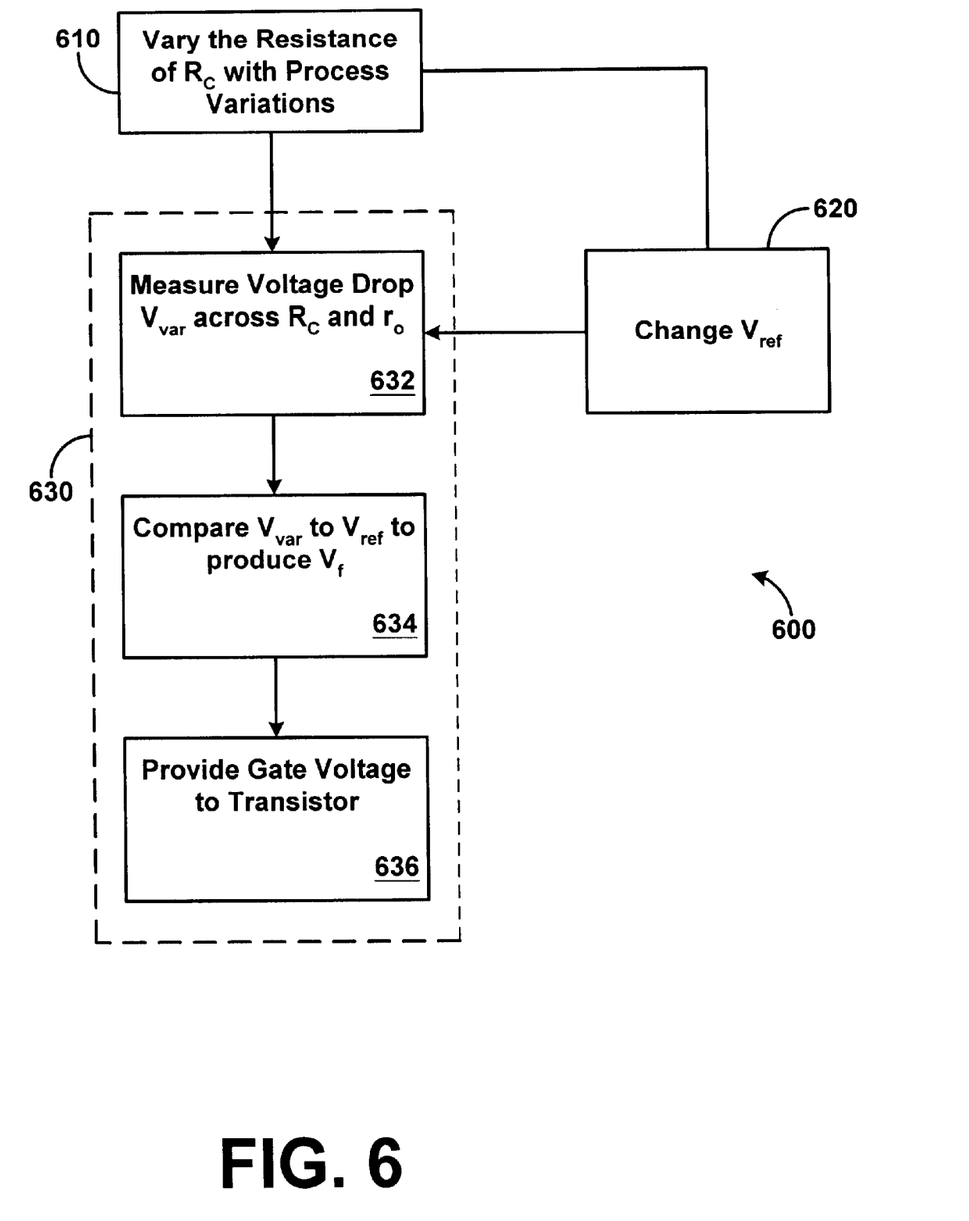
FIG. 6 is a block diagram illustrating a method for tuning an RC continuous-time filter in accordance with embodiments of the present invention.

FIG. 6 is a block diagram illustrating a method 600 for tuning an RC continuous-time filter in accordance with embodiments of the present invention. Generally, the method 600 can tune the filter for process variations as well as fine tune the filter for variations caused by temperature changes.

The method 600 begins with varying the resistance of the coarse-tuned resistive elements for process variations, such as the particular DSL protocol utilized (step 610). This may be done in a number of ways including a discrete switching system, such as the system disclosed in U.S. utility patent application entitled "Filter Tuner System and Method," having Ser. No. 09/971,484, filed Oct. 5, 2001 and incorporated by reference herein in its entirety. In the preferred embodiment, this is usually done during a training phase.

The next step is to continuously adjust the resistance of a MOSFET transistor in series with each resistive element, such that the adjustment in the resistance of each transistor offsets the adjustment in the resistance of each resistive element due to temperature variations (step 630). This is typically done "on-the-fly." This step may being by measuring a voltage drop across a similar resistive element and MOSFET transistor (step 632). This may be accomplished by driving a reference current across the two elements. Although the same physical resistive element may not be utilized in generating the gate voltage as to the resistive element of each integrator, the resistive elements may react to temperature in the same manner if they are of the same die. Next, comparing the voltage drop to a predefined reference voltage (step 634). This step may produce a gate voltage, which can be provided to the gate of each MOSFET transistor (step 636) to vary the internal resistance of the transistor.

The provided reference voltage may be changed in accordance with the changes made to the resistance of the coarse-tuned resistive element (step 620). The reference voltage and/or the reference current may be changed to account for this known change in resistance due to process variations.

It should be emphasized that the above-described embodiments of the present invention, particularly, any "preferred" embodiments, are merely possible examples of implementations set forth for a clear understanding of the principles of the invention. Many variations and modifications may be made to the above-described embodiment(s) of the invention, such as the particular method in which the fine-tuning voltage is generated and the method in which the coarse-tuned resistive element is tuned, without departing substantially from the spirit and principles of the invention. All such modifications and variations are intended to be included herein within the scope of the present invention and protected by the following claims.

The following is claimed:

1. A method for tuning an RC continuous-time filter, the method comprising:

varying a resistance of a coarse-tuned resistive element coupled to an input of the filter for varying a cut-off frequency of the filter based upon process variations; and continuously adjusting a resistance of a MOSFET transistor in series with the coarse-tuned resistive element, such that the adjustment in the resistance of the MOSFET transistor offsets the adjustment in the resistance of the resistive element caused by temperature variations.

2. The method of claim 1, wherein the step of continuously adjusting the resistance of the transistor comprises:

measuring a voltage drop across a second resistive element and a second MOSFET transistor, wherein the second resistive element responds to temperature variations in substantially the same way as the coarse-tuned resistive element;

comparing the voltage drop to a reference voltage such that a voltage offset is produced; and providing the voltage offset to the gate of the first MOSFET transistor, thereby adjusting a gate to source voltage of the first MOSFET transistor.

3. The method of claim 2, wherein the step of measuring comprises:

driving the second resistive element and the second transistor with a reference current.

4. The method of claim 2, wherein the second resistive element is on a same die as the first resistive element.

5. The method of claim 2, further comprising:

changing the reference current in accordance with the process variations to account for changes in the resistive element.

6. A system for tuning an RC continuous-time filter, the system comprising:

a coarse-tuned resistive element coupled to an input of the filter for varying a cut-off frequency of the filter based upon process variations;

a MOSFET transistor coupled to the coarse-tuned resistive element, wherein the MOSFET transistor provides a resistance that is dependent upon a gate voltage provided to a gate of the transistor, wherein the resistance of the transistor offsets an adjustment in a resistance of the resistive element caused by temperature variations; and a gate voltage generator configured to provide a gate voltage to the transistor.

7. The system of claim 6, wherein the MOSFET transistor is biased in the triode region.

8. The system of claim 6, wherein the voltage offset generator comprises:

a second resistive element, wherein the second resistive element responds to temperature variations in substantially the same way as the coarse-tuned resistive element;

a second MOSFET transistor having similar device characteristics as the first MOSFET transistor; and a comparator configured to compare a voltage drop across the second resistive element and the second transistor against a reference voltage, whereby the voltage offset is produced.

9. The system of claim 8, wherein the comparator is configured as a non-inverting comparator.

10. The system of claim 8, wherein a reference current is driven through the second resistive element and the second transistor to produce the voltage drop.

11. The system of claim 8, wherein the second resistive element is on a same die as the first resistive element.

12. A digital subscriber line (DSL) interface card comprising the system of claim 6.

13. The DSL interface card of claim 12, wherein the interface card is configured for Very High bit-rate DSL (VDSL) communication.

14. An automatically-tunable RC integrator comprising:
a coarse-tuned resistive element coupled to an input of the integrator for varying a cut-off frequency of the integrator based upon process variations; and
a MOSFET transistor coupled to the coarse-tuned resistive element, wherein the MOSFET transistor provides a resistance that is dependent upon a voltage offset provided to a gate of the MOSFET transistor, wherein the resistance of the transistor offsets an adjustment in a resistance of the coarse-tuned resistive element caused by temperature variations.

15. The integrator of claim 14, wherein the MOSFET transistor is biased in the triode region.

16. The integrator of claim 14, further comprising a voltage offset generator configured to provide the voltage offset to the transistor, the voltage offset generator comprising:
a second resistive element, wherein the second resistive element responds to temperature variations in substantially the same manner as the coarse-tuned resistive element;
a second MOSFET transistor having similar device characteristics as the first MOSFET transistor; and
a comparator configured to compare a voltage drop across the second resistive element and the second transistor against a reference voltage, whereby the voltage offset is produced.

17. The integrator of claim 16, wherein the comparator is configured in a non-inverting configuration.

18. The integrator of claim 16, wherein a reference current is driven through the second resistive element and the second transistor to produce the voltage drop.

19. The integrator of claim 16, wherein the second resistive element is on a same die as the first resistive element.

20. A system for tuning an RC integrator, the system comprising:
means for varying a resistance of a coarse-tuned resistive element coupled to an input of the integrator for varying a cut-off frequency of the integrator based upon process variations, and
means for continuously adjusting a resistance of a MOSFET transistor in series with the coarse-tuned resistive element, such that the adjustment in the resistance of the transistor offsets the adjustment in a resistance of the resistive element caused by temperature variations.

21. The system of claim 20, wherein the means for continuously adjusting the resistance of the transistor comprises:
means for measuring a voltage drop across a second resistive element and a second MOSFET transistor, wherein the second resistive element responds to temperature variations in substantially the same manner as the coarse-tuned resistive element;
means for comparing the voltage drop to a reference voltage such that a voltage offset is produced; and
means for providing the voltage offset to a gate of the first transistor, thereby adjusting the gate to source voltage of the transistor.

22. The system of claim 21, further comprising:
means for changing the reference voltage in accordance with the process variations to account for changes in the resistive elements.

23. A digital subscriber line (DSL) interface card comprising the system of claim 18.

24. The DSL interface card of claim 21, wherein the interface card is configured for Very High bit-rate DSL (VDSL) communication.

* * * * *